US 9,899,475 B2

(12) United States Patent
Yu et al.

(10) Patent No.: US 9,899,475 B2
(45) Date of Patent: Feb. 20, 2018

(54) EPITAXIAL CHANNEL WITH A COUNTER-HALO IMPLANT TO IMPROVE ANALOG GAIN

(71) Applicant: Taiwan Semiconductor Manufacturing Co., Ltd., Hsin-Chu (TW)

(72) Inventors: Tsung-Hsing Yu, Taipei (TW); Shih-Syuan Huang, Taichung (TW); Ken-Ichi Goto, Hsin-Chu (TW); Yi-Ming Sheu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/172,417

(22) Filed: Jun. 3, 2016

(65) Prior Publication Data

US 2016/0284800 A1    Sep. 29, 2016

Related U.S. Application Data

(62) Division of application No. 14/156,496, filed on Jan. 16, 2014, now Pat. No. 9,425,099.

(51) Int. Cl.
*H01L 29/10*    (2006.01)
*H01L 21/8234*    (2006.01)
(Continued)

(52) U.S. Cl.
CPC .... *H01L 29/1054* (2013.01); *H01L 21/26586* (2013.01); *H01L 21/823412* (2013.01);
(Continued)

(58) Field of Classification Search
None
See application file for complete search history.

(56) References Cited

U.S. PATENT DOCUMENTS 5,355,006 A   10/1994   Iguchi
5,561,302 A   10/1996   Candelaria
(Continued)

FOREIGN PATENT DOCUMENTS

| KR | 20100080159 A | 7/2010 |
|---|---|---|
| KR | 20130049541 A | 5/2013 |
| TW | 201349304 A | 12/2013 |

OTHER PUBLICATIONS

Notice of Allowance dated Aug. 27, 2015 U.S. Appl. No. 14/156,515.
(Continued)

*Primary Examiner* — Andres Munoz
(74) *Attorney, Agent, or Firm* — Eschweiler & Potashnik, LLC

(57) ABSTRACT

The present disclosure relate to an integrated chip having long-channel and short-channel transistors having channel regions with different doping profiles. In some embodiments, the integrated chip includes a first gate electrode arranged over a first channel region having first length, and a second gate electrode arranged over a second channel region having a second length greater than the first length. The first channel region and the second channel region have a dopant profile, respectively along the first length and the second length, which has a dopant concentration that is higher by edges than in a middle of the first channel region and the second channel region. The dopant concentration is also higher by the edges of the first channel region than by the edges of the second channel region.

20 Claims, 9 Drawing Sheets

(51) Int. Cl.
    *H01L 27/088*     (2006.01)
    *H01L 29/165*     (2006.01)
    *H01L 29/78*     (2006.01)
    *H01L 29/66*     (2006.01)
    *H01L 21/265*     (2006.01)

(52) U.S. Cl.
    CPC .... *H01L 21/823425* (2013.01); *H01L 27/088* (2013.01); *H01L 29/1083* (2013.01); *H01L 29/165* (2013.01); *H01L 29/6659* (2013.01); *H01L 29/66492* (2013.01); *H01L 29/7833* (2013.01); *H01L 21/2658* (2013.01)

(56) References Cited

U.S. PATENT DOCUMENTS

| | | | |
|---|---|---|---|
| 6,040,208 | A | 3/2000 | Honeycutt et al. |
| 6,215,148 | B1 | 4/2001 | Eitan |
| 6,541,343 | B1 | 4/2003 | Murthy et al. |
| 6,566,204 | B1 | 5/2003 | Wang et al. |
| 6,589,847 | B1 | 7/2003 | Kadosh et al. |
| 6,849,890 | B2 | 2/2005 | Kokubun |
| 7,276,407 | B2 | 10/2007 | Yamagata et al. |
| 7,507,999 | B2 | 3/2009 | Kusumoto et al. |
| 7,943,468 | B2 | 5/2011 | Curello |
| 7,952,149 | B2 | 5/2011 | Dokumacu et al. |
| 8,034,679 | B1 | 10/2011 | Bulucea |
| 8,298,895 | B1 | 10/2012 | Alptekin |
| 8,404,546 | B2 | 3/2013 | Woon et al. |
| 8,557,659 | B2 | 10/2013 | Teo et al. |
| 8,569,156 | B1 | 10/2013 | Scudder et al. |
| 8,659,054 | B2 | 2/2014 | Rim et al. |
| 8,669,615 | B1 | 3/2014 | Chang et al. |
| 8,772,095 | B2 | 7/2014 | Kim et al. |
| 9,224,814 | B2 | 12/2015 | Yu et al. |
| 9,419,136 | B2 | 8/2016 | Tsung |
| 2001/0004332 | A1 | 6/2001 | Eitan |
| 2002/0033511 | A1 | 3/2002 | Babcock et al. |
| 2003/0008484 | A1 | 1/2003 | Hook |
| 2003/0075719 | A1 | 4/2003 | Sriram |
| 2005/0023535 | A1 | 2/2005 | Sriram |
| 2005/0173739 | A1 | 8/2005 | Kusumoto et al. |
| 2005/0285212 | A1 | 12/2005 | Tolchinsky et al. |
| 2006/0065937 | A1 | 3/2006 | Hoffmann et al. |
| 2006/0220098 | A1 | 10/2006 | Lee et al. |
| 2006/0286729 | A1 | 12/2006 | Kavalieros |
| 2007/0190731 | A1 | 8/2007 | Chen et al. |
| 2008/0195983 | A1 | 8/2008 | Chidambarrao et al. |
| 2008/0237709 | A1 | 10/2008 | Chidambarrao et al. |
| 2008/0242032 | A1 | 10/2008 | Chakravarthi et al. |
| 2008/0272395 | A1 | 11/2008 | Banna |
| 2008/0272408 | A1 | 11/2008 | Vora |
| 2009/0289280 | A1 | 11/2009 | Zhang et al. |
| 2010/0317169 | A1 | 12/2010 | Sung et al. |
| 2010/0330763 | A1 | 12/2010 | Freeman et al. |
| 2011/0031503 | A1 | 2/2011 | Doris et al. |
| 2011/0079861 | A1 | 4/2011 | Shifren et al. |
| 2011/0215376 | A1 | 9/2011 | Holt et al. |
| 2012/0135575 | A1 | 5/2012 | Wong et al. |
| 2013/0113041 | A1 | 5/2013 | Liu et al. |
| 2013/0200455 | A1 | 8/2013 | Lo et al. |
| 2014/0197411 | A1 | 7/2014 | Vakada et al. |
| 2014/0252504 | A1 | 9/2014 | Chuang et al. |
| 2015/0028426 | A1 | 1/2015 | Ching |
| 2015/0243759 | A1 | 8/2015 | Huang et al. |
| 2015/0263092 | A1 | 9/2015 | Hsiao et al. |
| 2015/0295085 | A1 | 10/2015 | Yu et al. |

OTHER PUBLICATIONS

Non Final Office Action dated Aug. 28, 2015 U.S. Appl. No. 14/208,353.
Notice of Allowance dated Sep. 9, 2015 U.S. Appl. No. 14/156,505.
Notice of Allowance dated Mar. 28, 2016 U.S. Appl. No. 14/208,353.
Non Final Office Action dated Apr. 14, 2016 U.S. Appl. No. 14/880,469.
Non Final Office Action dated Nov. 27, 2015 for U.S. Appl. No. 14/156,496.
Notice of Allowance dated Mar. 30, 2016 for U.S. Appl. No. 14/156,496.
Notice of Allowance dated Sep. 14, 2016 U.S. Appl. No. 14/880,469.
Notice of Allowance dated Jul. 14, 2016 U.S. Appl. No. 14/880,392.
Streetman, et al. "Solid State Electronic Devices." Fifth Edition. Published in 2000. pp. 311-315.
U.S. Appl. No. 14/156,505, filed Jan. 16, 2014.
U.S. Appl. No. 14/156,515, filed Jan. 16, 2014.
U.S. Appl. No. 14/156,546, filed Jan. 16, 2014.
U.S. Appl. No. 14/208,353, filed Mar. 13, 2014.
Non Final Office Action dated Feb. 23, 2015 U.S. Appl. No. 14/156,546.
Chih-Cheng Lu, et al.; "Strained Silicon Technology: Mobility Enhancement and Improved Short Channel Effect Performance by Stress Memorization Technique on nFET Devices"; Journal of the Electrochemical Society; Oct. 8, 2009, p. 1-4.
S. Flachowsky, et al.; "Stress Memorization Technique for n-MOSFETs: Where is the Stress Memorized?"; ULIS 2010—Ultimate Integration on Silicon; University of Glasgow; Mar. 2010; p. 1-4.
Nuo Xu; "Effectiveness of Strain Solutions for Next-Generation MOSFETs"; University of California—Berkley; Spring 2012; p. 1-103.
Shen, et al. "Molecular Dynamic Simulation Study of Stress Memorization in Si Dislocations." IEEE International Conference: Electron Devices Meeting (IEDM), 2012.
U.S. Appl. No. 13/288,201, filed Nov. 3, 2011.
U.S. Appl. No. 14/252,147, filed Apr. 14, 2014.
Non Final Office Action dated May 15, 2015 U.S. Appl. No. 14/156,515.
Notice of Allowance dated Jun. 26, 2015 for U.S. Appl. No. 14/156,546.
Notice of Allowance dated Jul. 24, 2015 U.S. Appl. No. 14/252,147.
Non-Final Office Action in connection with U.S. Appl. No. 15/345,814.
Notice of Allowance in connection with U.S. Appl. No. 14/935,760.
Notice of Allowance in connection with U.S. Appl. No. 15/345,814.

EPITAXIAL CHANNEL WITH A COUNTER-HALO IMPLANT TO IMPROVE ANALOG GAIN

REFERENCE TO RELATED APPLICATION

This Application is a Divisional of U.S. application Ser. No. 14/156,496 filed on Jan. 16, 2014, the contents of which is hereby incorporated by reference in its entirety.

BACKGROUND

Transistors are highly utilized in modern integrated circuits (ICs) for amplifying or switching electronic signals. A modern semiconductor IC contains millions or even billions of transistors on a single IC. To ensure proper yield the transistors are manufactured with accurate and precise placement of their various components and constituents. One such constituent is dopant impurities that are introduced into the channel region of a transistor. The dopant impurities directly influence the functionality and performance of the transistor. The characteristics and location of the dopant impurities, or the "dopant profile," must be carefully controlled. Variations within a semiconductor manufacturing process can cause variation in the transistor device, performance degradation, and possible yield loss.

DETAILED DESCRIPTION

Figure 1A:
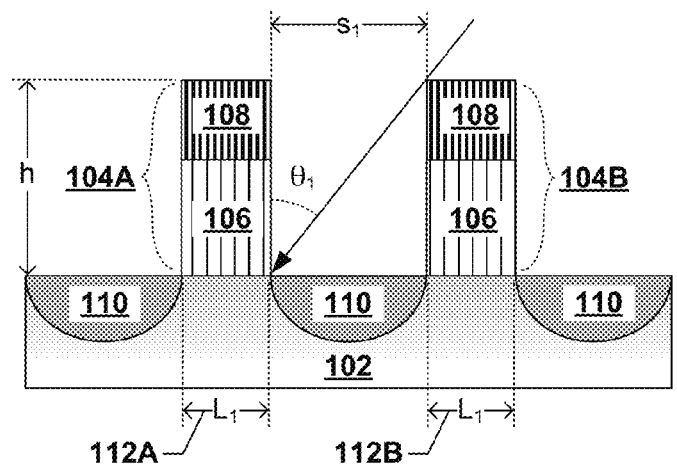
FIGS. 1A-1B illustrate cross-sectional views of some embodiments of performing a counter-halo implant in a long-channel transistor while simultaneously shadowing the counter-halo implant in a short-channel transistor.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

Short-channel length transistors formed semiconductor substrates are subject to drain-induced barrier lowering (DIBL) over comparatively long-channel transistors due to low channel doping or source/drain junctions which are too deep. DIBL results in leakage between the source and drain of a transistor, which can result in a loss gate control. To combat this effect, a localized halo implant is utilized to increase channel dopant concentrations near the source/drain regions of the channel. The higher doping in these regions reduces interaction between the source and drain without influencing the threshold voltage ($V_{th}$) of the device. However, while the halo implant can improve the performance and decrease leakage in short-channel transistors, it can degrade the source-to-drain transconductance ($G_{ds}$) of long-channel transistors.

Accordingly, some embodiments of the present disclosure relate to an implant that improves long-channel transistor performance with little to no impact on short-channel transistor performance. To mitigate DIBL, both long-channel and short-channel transistors on a substrate are subjected to a halo implant. While the halo implant improves short-channel transistor performance, it degrades long-channel transistor performance. Therefore, a counter-halo implant is performed on the long-channel transistors only to restore their performance. To achieve this, the counter-halo implant is performed at an angle that introduces dopant impurities near the source/drain regions of the long-channel transistors to counteract the effects of the halo implant, while the counter-halo implant is simultaneously shadowed from reaching the channel of the short-channel transistors. The embodiments disclosed herein can improve long-channel transistor DIBL, $G_{ds}$, and gain with little to no impact on short channel transistor performance, and without additional mask cost.

Figure 1B:
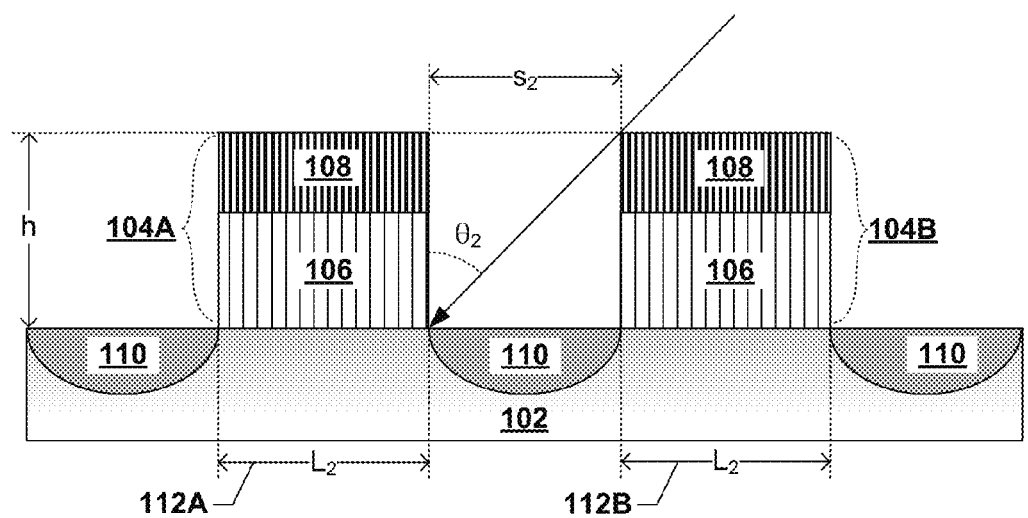

FIG. 1A illustrates a cross-sectional view of some embodiments of a pair of short-channel transistors 100A formed on a substrate 102, including first and second channel regions 112A, 112B of channel length $L_1$ residing between a plurality of source/drain regions 110. The pair of short-channel transistors also include first and second gate structures 104A, 104B each composed of a hard mask (HM) 108 disposed on a gate electrode 106. For the short-channel transistors 100A, the first and second gate structures 104A, 104B have a vertical dimension (h) and are separated by a first horizontal space ($s_1$). FIG. 1B illustrates a cross-sectional view of some embodiments of a pair of long-channel transistors 100B composed the same components and constituents as the pair of short-channel transistors 100A, but having first and second channel regions 112A, 112B of channel length $L_2$, where $L_2 > L_1$. Additionally, the pair of long-channel transistors 100B are separated by a second horizontal space ($s_2$).

Both the short-channel transistors 100A and long-channel transistors 100B have been subjected to halo implantation to alleviate DIBL within the short-channel transistors 100A. In order to counteract the effects of $G_{ds}$ degradation within the long-channel transistors 100B, a counter-halo implant is performed on the pair long-channel transistors 100B only to restore their performance. To achieve this, an implant angle is chosen such that implanted dopant impurities reach the first and second channel regions 112A, 112B of the long-channel transistors 100B, but are blocked from reaching the first and second channel regions 112A, 112B of the short-channel transistors 100A.

For the short-channel transistors 100A, a first angle ($\theta_1$) greater than arctangent($s_1$/h) will not allow the counter-halo implant to reach the first and second channel regions 112A, 112B of the short-channel transistors 100A due to shadowing of the implant by an adjacent gate structure. Conversely, for the long-channel transistors 100B, a second angle ($\theta_2$) of less than arctangent($s_2$/h) will allow the counter-halo implant to reach the first and second channel regions 112A, 112B of the long-channel transistors 100B. Therefore, a counter-halo implant angle of $\theta_2 > \theta > \theta_1$ will allow the counter-halo implant to reach only the first and second channel regions 112A, 112B of the long-channel transistors 100B, while not impacting the short-channel transistors 100A. This avoids additional the cost and manufacturing overhead required to produce a dedicated mask to perform the counter-halo implant on the long-channel transistors 100B only.

Figure 2:
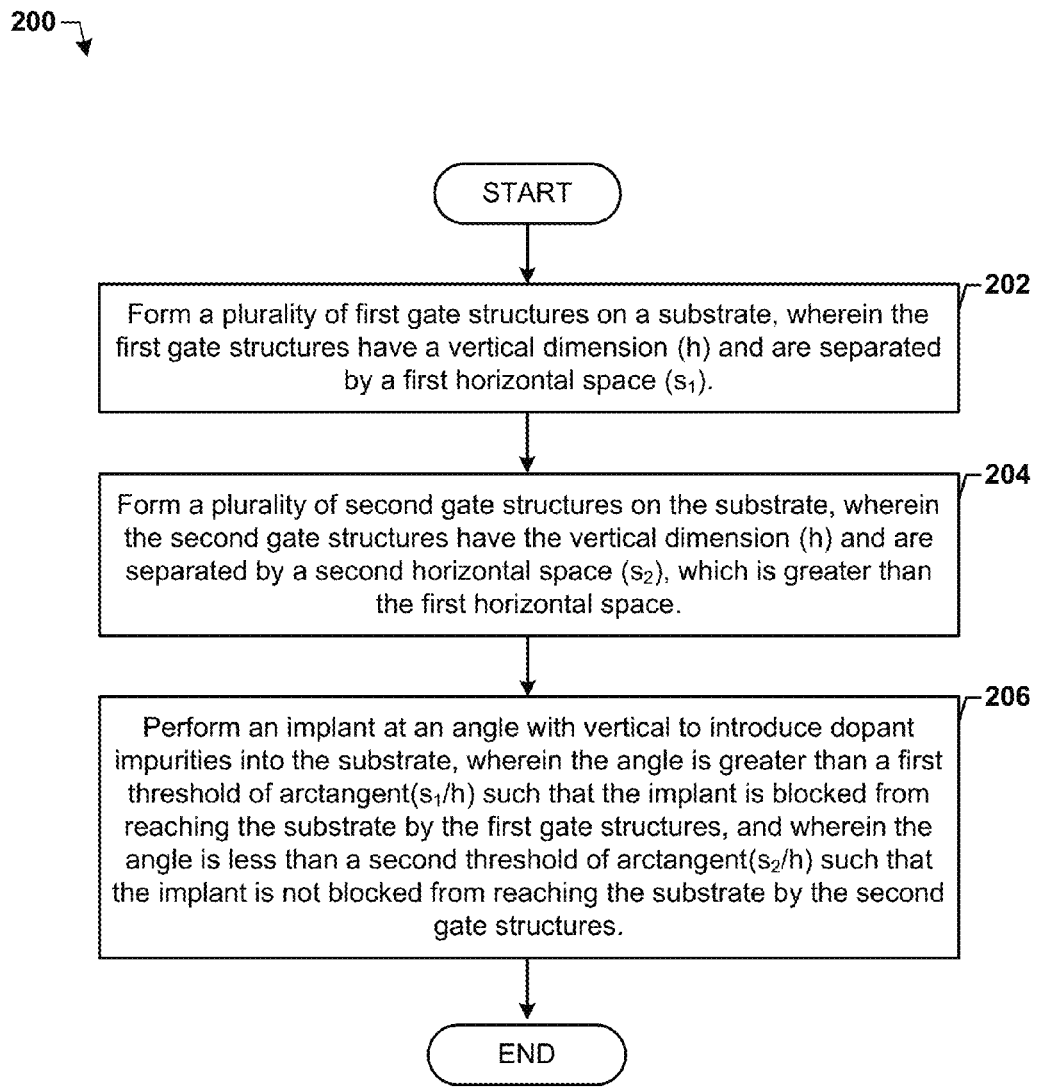
FIG. 2 illustrates some embodiments of a method of performing a counter-halo implant on a plurality of long-channel transistors while simultaneously shadowing the counter-halo implant on a plurality of short-channel transistors.

FIG. 2 illustrates some embodiments of a method of 200 performing a counter-halo implant on a plurality of long-channel transistors while simultaneously shadowing the counter-halo implant on a plurality of short-channel transistors. While the method 200, and subsequently the method 400, are described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 202 a plurality of first gate structures are formed on a substrate. The first gate structures have a vertical dimension (h) and are separated by a first horizontal space ($s_1$).

At 204 a plurality of second gate structures are formed on the substrate. The second gate structures have the vertical dimension (h) and are separated by a second horizontal space ($s_2$), which is greater than the first horizontal space ($s_1$).

At 206 a counter-halo implant is performed at an angle with vertical to introduce dopant impurities into the substrate. The angle is greater than a first threshold of arctangent ($s_1$/h) such that the implant is blocked from reaching the substrate by the first gate structures. Also, the angle is less than a second threshold of arctangent($s_2$/h) such that the implant is not blocked from reaching the substrate by the second gate structures.

FIGS. 3A-3J illustrate cross-sectional views of some embodiments of forming a transistor with a counter-halo implant.

Figure 3A:
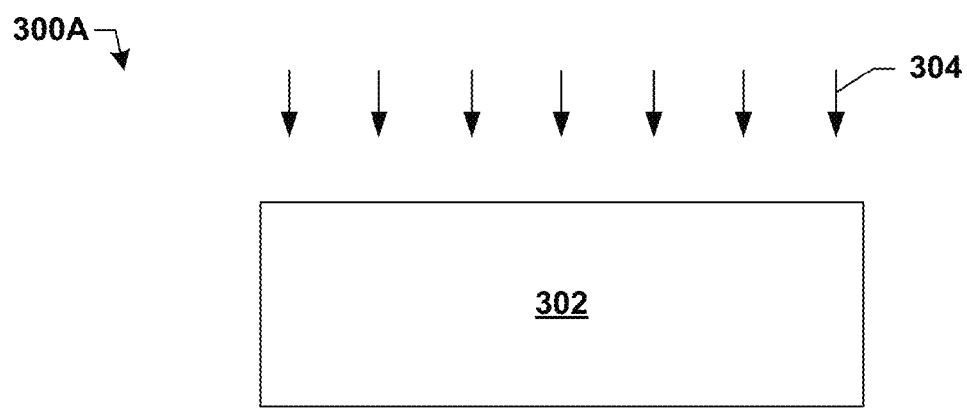
FIGS. 3A-3J illustrate cross-sectional views of some embodiments of forming a transistor with a counter-halo implant.

FIG. 3A illustrates a cross-sectional view of some embodiments of a substrate 302, where a well and $V_{th}$ implant 304 is used to introduce dopant impurities of a first impurity type into a transistor region of the substrate 302. The $V_{th}$ implant introduces the impurities of the first impurity type into the transistor region of the substrate 302 to adjust the $V_{th}$ of a transistor formed in subsequent processing steps. In some embodiments, the dopant impurities include p-type dopant impurities such as boron, carbon, indium, etc. In some embodiments, the dopant impurities include n-type dopant impurities such as phosphorous, antimony, or arsenic, etc. In various embodiments, the $V_{th}$ implant uses an implant energy in a range of about 5 keV to about 150 keV.

Figure 3B:
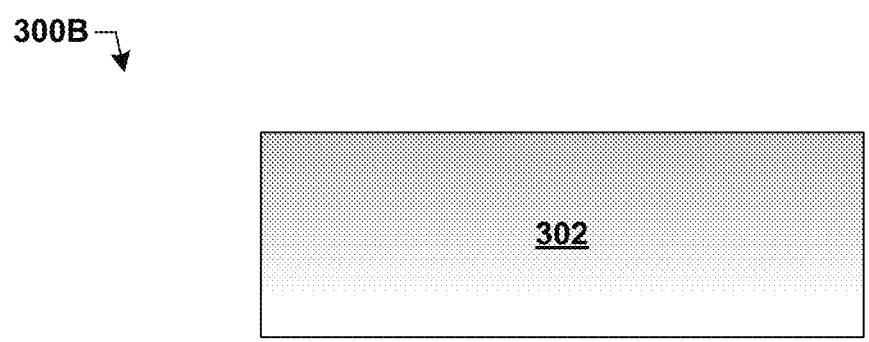

FIG. 3B illustrates a cross-sectional view of some embodiments of the substrate 302, where an annealing operation is used to activate the implanted dopants, or to eliminate crystalline defects introduced during the well and $V_{th}$ implant 304, and promote diffusion and redistribution of dopant impurities. Various conventional annealing operations may be used and the annealing operations may drive the implanted dopant impurities deeper into semiconductor substrate 302 as indicated by darkness gradient of the substrate 302 in FIG. 3B.

Figure 3C:
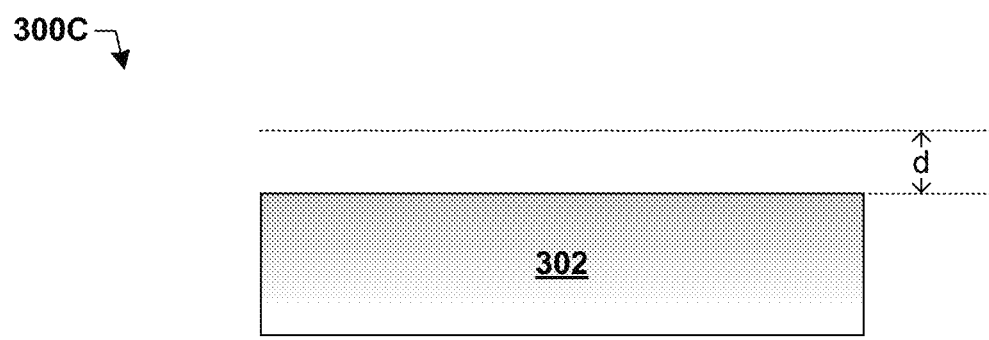

FIG. 3C illustrates a cross-sectional view of some embodiments of the substrate 302, which is recessed to a depth (d) in the transistor region. In some embodiments, formation of the recess includes one or more etching process(es), including but not limited to a dry process(es) such as a plasma etching process, wet etching process(es), or a combination of both. In some embodiments, a wet etch is used to form the recess. For example, an etchant such as carbon tetrafluoride ($CF_4$), HF, tetramethylammonium hydroxide (TMAH), or combinations of thereof, or the like may be used to perform the wet etch and form the recess.

Figure 3D:
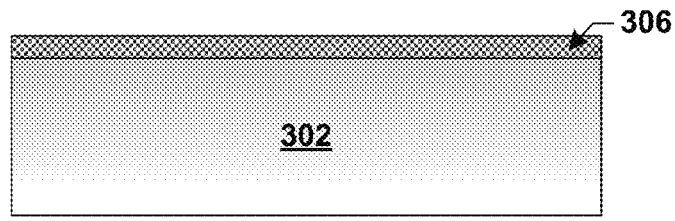

FIG. 3D illustrates a cross-sectional view of some embodiments of the substrate 302, where a layer of carbon-containing material 306 is disposed over the transistor region. In some embodiments, the carbon-containing material 306 includes silicon carbide (SiC).

Figure 3E:
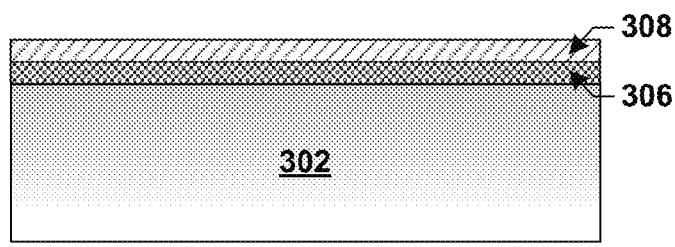

FIG. 3E illustrates a cross-sectional view of some embodiments of the substrate 302, where a layer of substrate material 308 is disposed over the layer of carbon-containing material 306. In some embodiments, the layer of substrate material 308 includes silicon (Si). In various embodiments, the layer of carbon-containing material 306 and the layer of substrate material 308 are disposed by a suitable epitaxial method such as chemical vapor deposition (CVD), low pressure CVD (LPCVD), atomic layer CVD (ALCVD), ultrahigh vacuum CVD (UHVCVD), reduced pressure CVD (RPCVD), any suitable CVD; molecular beam epitaxy (MBE) processes, or any suitable combinations thereof. In some embodiments, the layer of carbon-containing material 306 has a thickness in a range of about 2 nanometers (nm) to about 15 nm. In some embodiments, the layer of substrate material 308 has a thickness in a range of about 5 nm to about 30 nm.

Figure 3F:
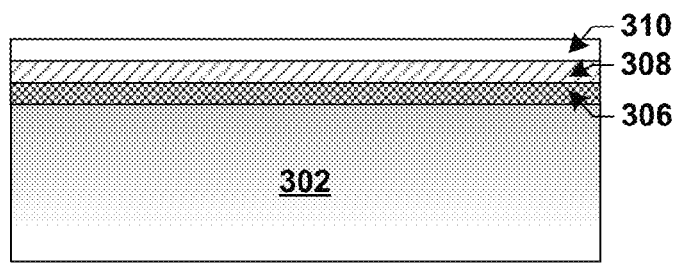

FIG. 3F illustrates a cross-sectional view of some embodiments of the substrate 302, where a gate dielectric 310 is disposed over the layer of substrate material 308. In various embodiments, disposal of the gate dielectric 310 is achieved by the aforementioned epitaxial methods, or by various suitable dielectric deposition processes. In some embodiments, gate dielectric 310 includes a high-k dielectric layer such as hafnium oxide (HfO). Other embodiments may use other suitable high-k gate dielectric materials. Other embodiments may utilize an oxide layer such as silicon dioxide ($SiO_2$). In some embodiments, the gate dielectric 310 has a thickness in a range of about 1 nm to about 30 nm.

Figure 3G:
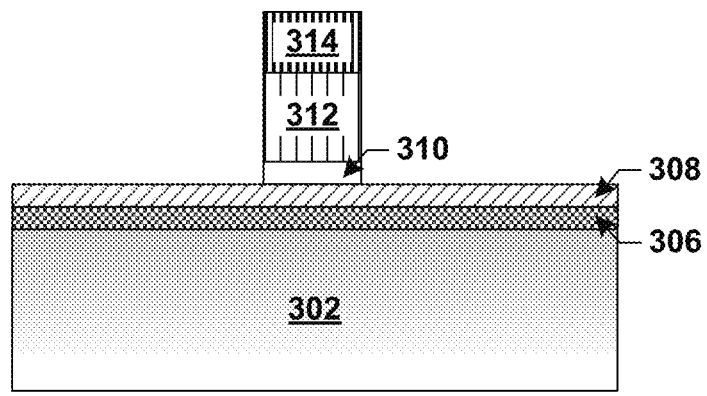

FIG. 3G illustrates a cross-sectional view of some embodiments of the substrate 302, where a gate structure (312, 314) is disposed over the gate dielectric 310 in the channel region of the substrate 302. For the embodiments of FIG. 3G, the gate structure includes a gate electrode 312 (e.g., polysilicon) disposed over the gate dielectric 310, and a hard mask 314 formed over the gate electrode 312. In various embodiments, the gate structure is formed by a suitable lithography method including, but to, optical lithography, multiple patterning (MP) optical lithography (e.g., double-patterning), deep ultraviolet (UV) lithography, extreme UV (EUV) lithography, or other suitable patterning technique.

Figure 3H:
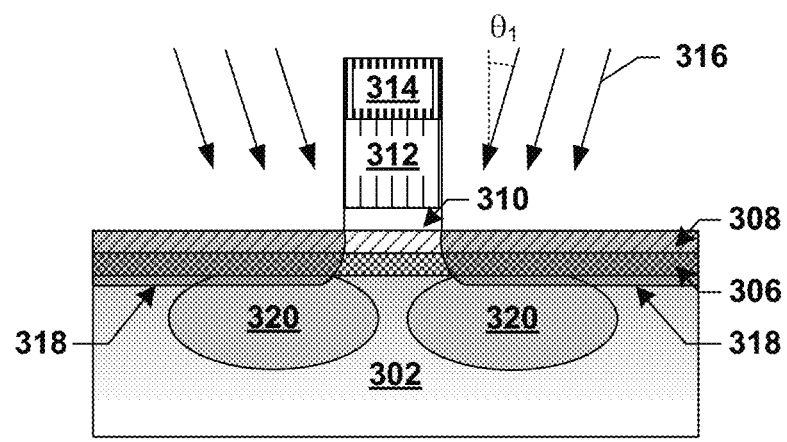

FIG. 3H illustrates a cross-sectional view of some embodiments of the substrate 302, where lightly-dopeddrain (LDD) implant (not shown) and a halo implant 316 is performed after patterning of the gate structure to form LDD regions 318. The LDD implant utilizes dopants of a second impurity type (i.e., n-type or p-type), opposite the first impurity type of the well and $V_{th}$ implants shown in FIG. 3A. For the embodiments of FIGS. 3A-3J, the LDD regions 318 utilize an n-type dopant (e.g., phosphorous, antimony, or arsenic, etc) and the well and $V_{th}$ implants 304 utilize a p-type dopant (e.g., boron, carbon, indium, etc.).

In various embodiments, the halo implant 316 is performed at a first tilt angle ($\theta_1$) of 20 degrees or less with respect to the vertical. The halo implant 316 introduces dopant impurities of the first impurity type (i.e., same as the well and $V_{th}$ implants 304) into highly-doped regions 320 on opposite edges the channel region formed below the gate structure to mitigate DIBL effects. In one exemplary embodiment, the halo implant 316 is used to introduce a mixture of indium and carbon. In another exemplary embodiment, the halo implant 316 is used to introduce indium, boron, or $BF_2$ into the highly-doped regions 320.

Figure 3I:
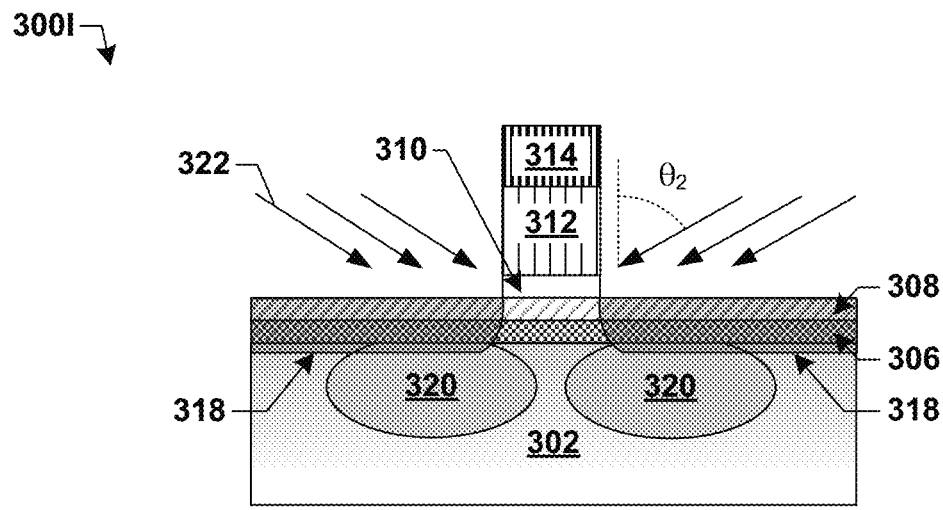

FIG. 3I illustrates a cross-sectional view of some embodiments of the substrate 302, where a counter-halo implant 322 is performed to deposit dopant impurities of the second impurity type (i.e., opposite the well and $V_{th}$ implant 304). The counter-halo implant 322 compensates for the highly-doped regions 320 at opposite edges the channel region. For embodiments where the substrate 302 includes transistors with multiple channel lengths, the counter-halo implant 322 is performed at a second tilt angle ($\theta_2$) with vertical. The second tilt angle ($\theta_2$) is chosen such that comparatively long-channel transistors receive the implant, while comparatively short-channel transistors do not receive the implant due to shadowing of the channel region of the short-channel transistors by adjacent gate structures, as seen in the embodiments of FIGS. 1A-1B. As a result of the counter-halo implant 322, the long-channel transistors' DIBL, $G_{ds}$, and gain are improved while the short-channel transistors remain unaffected.

In some embodiments, the epitaxial channel formed by the layer of substrate material 308 and the layer of carbon-containing material 306 is subjected to an additional "heavy dose" $V_{th}$ implant. The additional $V_{th}$ implant enhances source-to-drain current control within the epitaxial channel of the short-channel devices. However, the additional $V_{th}$ implant can also increase the $V_{th}$ of the long-channel transistors by about 30 mV to about 100 mV. Accordingly, the shadowing method used to expose only the long-channel transistors to the counter-halo implant 322 can also be used to counter-act the effects of the heavy dose $V_{th}$ implant. The epitaxial channels of the long-channel transistors can be isolated for a "long-channel $V_{th}$-reduction" implant by the shadowing method. The long-channel $V_{th}$-reduction implant is performed at the second tilt angle ($\theta_2$) such that comparatively long-channel transistors again receive the implant, while comparatively short-channel transistors again do not receive the implant due to shadowing. The conditions (e.g., dose, energy, etc.) of the long-channel $V_{th}$-reduction implant can be tuned to reduce the threshold voltage of the long-channel devices by the same amount that they were increased due to the heavy dose $V_{th}$ implant (e.g., by about 30 mV to about 100 mV). As a result, the $V_{th}$ of the long-channel transistors comprising epitaxial channels of the layer of substrate material 308 and the layer of carbon-containing material 306 can be made to be approximately equal to the $V_{th}$ of a long-channel transistor with a channel formed directly within a substrate 302 (i.e., without the epitaxial channel).

Figure 3J:
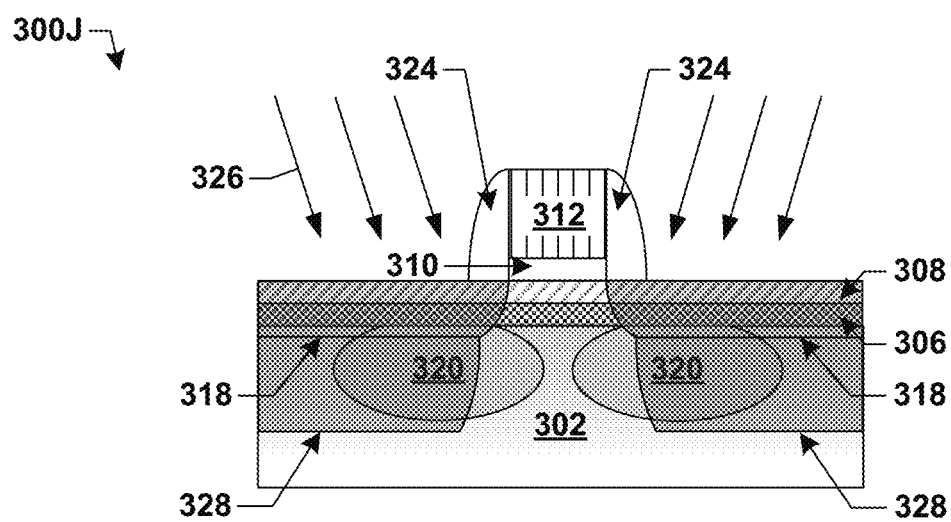

FIG. 3J illustrates a cross-sectional view of some embodiments of the substrate 302, where spacers 324 are formed. In various embodiments, the spacers 324 include combinations of oxide, silicon, and nitride. Subsequent to spacer formation, the substrate 302 is then subjected to source/drain implant 326, or embedded source/drain epitaxy (not shown), to form source/drains regions 328. The source/drains regions 328 include the second dopant impurity type (i.e., the same as the LDD regions 318).

Figure 4:
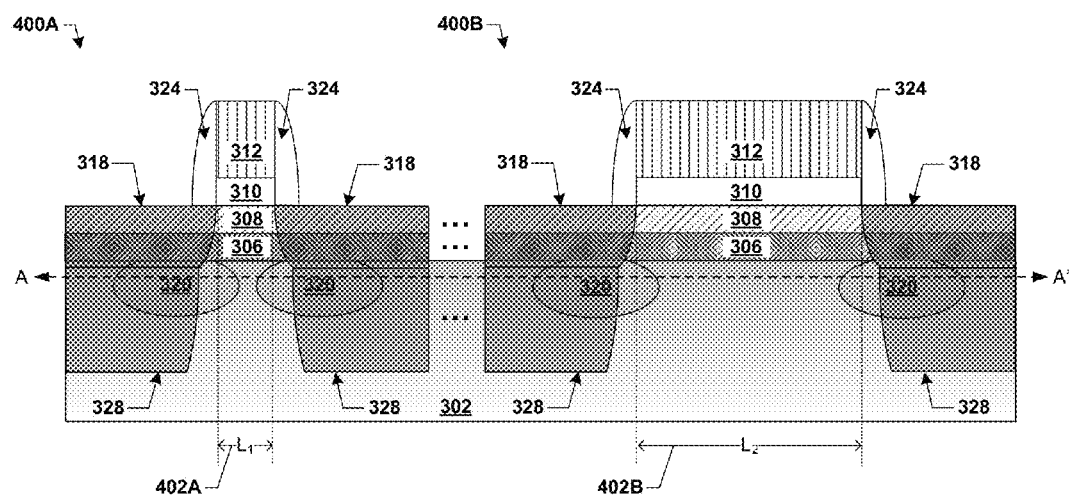
FIG. 4 illustrates a cross-sectional view of some embodiments a short-channel transistor and a long-channel transistor formed on a same substrate by the embodiments of FIGS. 3A-3J.

FIG. 4 illustrates a cross-sectional view of some embodiments a short-channel transistor 400A and a long-channel transistor 400B formed on a same substrate 302 by the embodiments of FIGS. 3A-3J. The short-channel transistor 400A does not receive the counter-halo implant 322, while the long-channel transistor 400B does. The short-channel transistor 400A has a first channel region of channel length $L_1$, and the long-channel transistor 400B has a second channel region of channel length $L_2$, where $L_2 > L_1$. For the embodiments of FIG. 4, the short-channel and long-channel transistors 400A, 400B include n-type metal-oxide field effect transistors (MOSFETs) formed on a silicon substrate 302. The short-channel and long-channel transistors 400A, 400B further include first and second channel regions 402A, 402B, which have been doped with a p-type dopant impurities (e.g., boron, carbon, indium, etc.) at higher concentration levels than other parts of the first and second channel region 402A, 402B. The LDD and source/drain regions 318, 328 are formed with n-type dopant impurities (e.g., phosphorous, antimony, or arsenic).

Figure 5A:
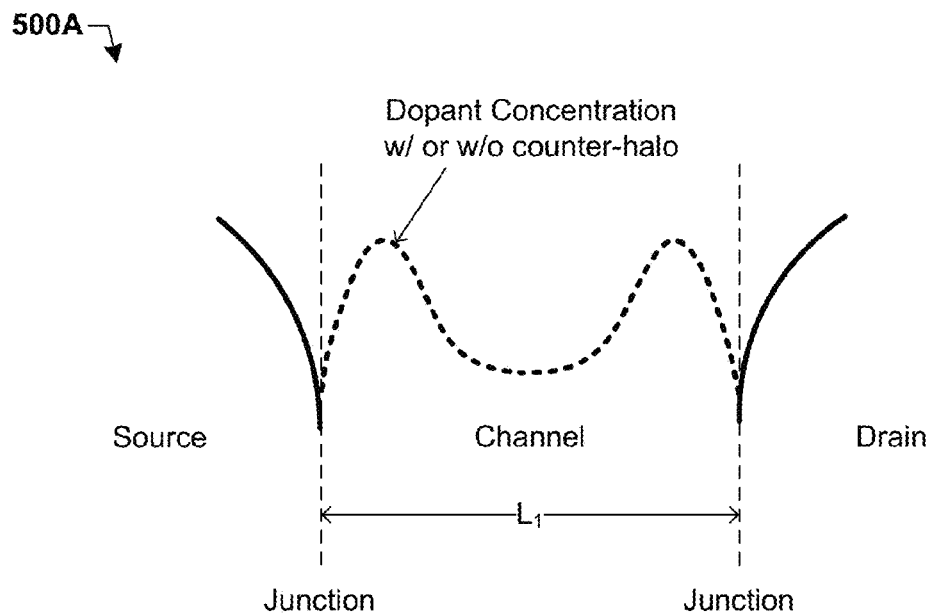
FIGS. 5A-5B illustrate graphs of some embodiments of dopant concentrations for a long-channel transistor that receives a counter-halo implant and a short-channel transistor that does not receive the counter-halo implant because of shadowing.
Figure 5B:
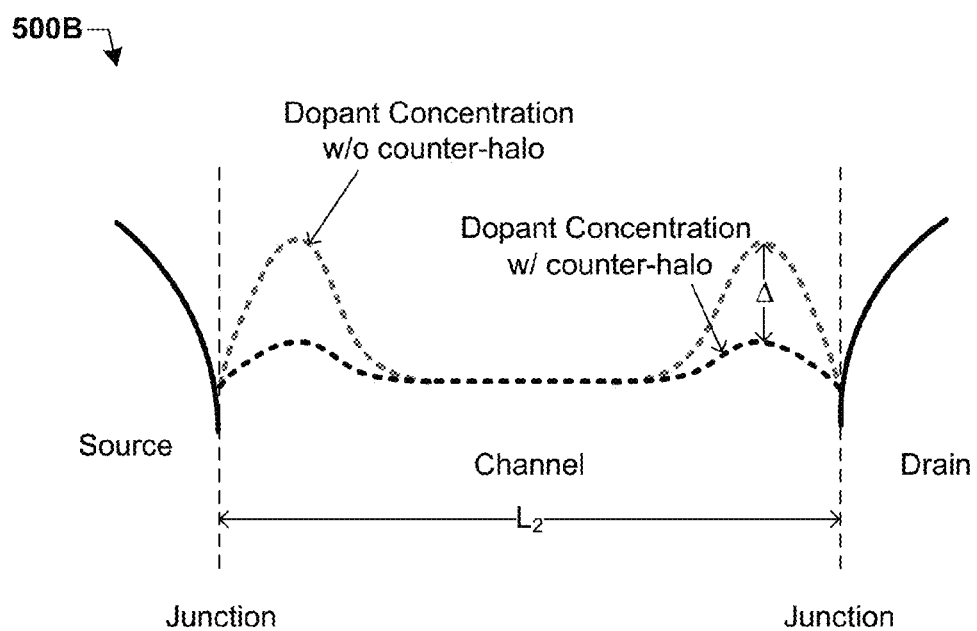

FIGS. 5A-5B illustrate graphs 500A, 500B of some embodiments of dopant concentrations for the short-channel transistor 400A and the long-channel transistor 400B along line AA' of FIG. 4. FIGS. 5A-5B illustrate that the dopant concentration is higher at the edges of both the first and second channel regions 402A, 402B before and after the counter-halo implant 322. However, it is observed that the dopant concentration at each end of the second channel region 402B is reduced by an amount Δ after the counter-halo implant 322. In the long-channel transistor 400B the dopant concentration created by the halo implant 316 can be compensated by the counter-halo implant 322, resulting in more flat channel profile along the channel direction AA' for the long-channel transistor 400B relative to the short-channel transistor 400A.

Note that although the above exemplary embodiment has been described for an n-type MOSET, the disclosed embodiments may apply to a p-type MOSFET as well by reversing the dopant types from those described herein.

Figure 6:
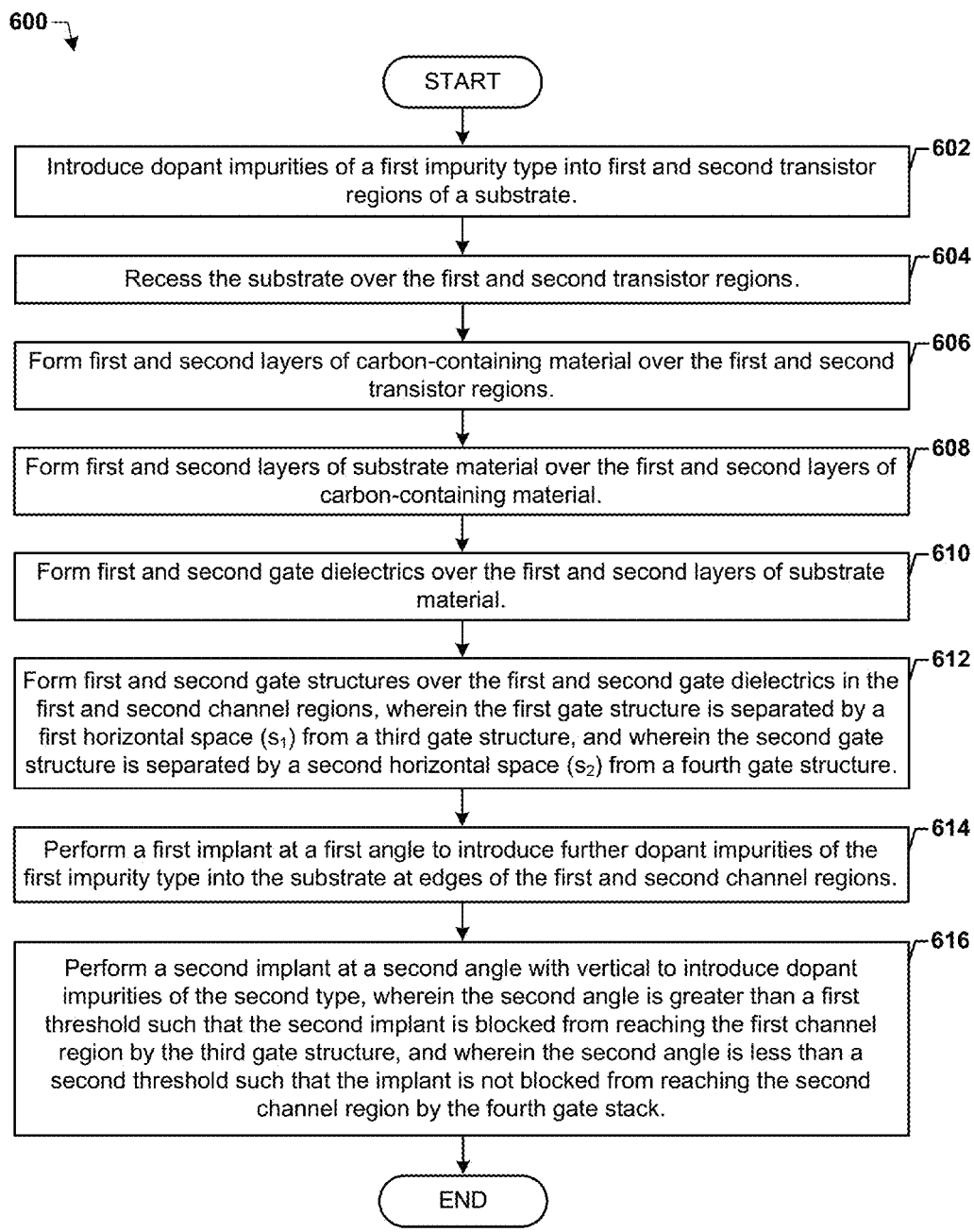
FIG. 6 illustrates some embodiments of a method of forming a long-channel transistor with a counter-halo implant while simultaneously preventing a short-channel transistor from receiving the counter-halo implant.

FIG. 6 illustrates some embodiments of a method 600 of forming a long-channel transistor with a counter-halo implant while simultaneously preventing a short-channel transistor from receiving the counter-halo implant.

At 602 dopant impurities of a first impurity type are introduced into first and second transistor regions of a substrate, where the first and second transistor region includes first and second channel regions and first and second source/drain regions, respectively. In some embodiments, an anneal is performed after introducing the dopant impurities of a first impurity type into the first and second transistor regions of the substrate.

At 604 the substrate is recessed over the first and second transistor regions.

At 606 first and second layers of carbon-containing material (e.g., silicon carbide) are formed over the first and second transistor regions.

At 608 first and second layers of substrate material (e.g., silicon) are formed over the first and second layers of carbon-containing material.

At 610 first and second gate dielectrics (e.g., HfO) are formed over the first and second layers of substrate material.

At 612 first and second gate structures are formed over the first and second gate dielectrics in the first and second channel regions. The first gate structure is separated by a first horizontal space ($s_1$) from a third gate structure. And, the second gate structure is separated by a second horizontal space ($s_2$) from a fourth gate structure, where $s_2>s_1$. The first through fourth gate structures all have vertical dimension (h).

At 614 a first implant (i.e., a halo implant) is performed at a first angle to introduce further dopant impurities of the first impurity type into the substrate at edges of the first and second channel regions.

At 616 a second implant (i.e., a counter-halo implant) is performed at a second angle with vertical to introduce dopant impurities of the second type, which is opposite the first impurity type, into the first and second channel regions. The second angle is greater than a first threshold of arctangent($s_1$/h) such that the second implant is blocked from reaching the first channel regions by the third gate structure. The second angle is also less than a second threshold of arctangent($s_2$/h) such that the implant is not blocked from reaching the second channel regions by the fourth gate structure.

In some embodiments, a third implant (e.g., "heavy dose" $V_{th}$ implant) is performed to introduce first additional dopant impurities into the first and second channel regions. The third implant enhances source-to-drain current control within the first channel region, but increases a threshold voltage within the second channel region by a delta value (e.g., in a range of about 30 mV to about 100 mV). In such embodiments, a fourth implant (e.g., a "long-channel $V_{th}$-reduction" implant) may be performed at the second angle with vertical to introduce second additional dopant impurities into the second channel region. The second additional dopant impurities are again blocked from reaching the first channel region by the third gate structure. The fourth implant reduces the threshold voltage within the second channel region by about the delta value. As a result, the $V_{th}$ of transistors with second channel regions comprising epitaxial channels can be made to be approximately equal to the $V_{th}$ of transistors with second channel regions formed directly within a substrate 302.

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein; such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, some embodiments of the present disclosure relate to an implant that improves long-channel transistor performance with little to no impact on short-channel transistor performance. To mitigate DIBL, both long-channel and short-channel transistors on a substrate are subjected to a halo implant. While the halo implant improves short-channel transistor performance, it degrades long-channel transistor performance. Therefore, a counter-halo implant is performed on the long-channel transistors only to restore their performance. To achieve this, the counter-halo implant is performed at an angle that introduces dopant impurities near the source/drain regions of the long-channel transistors to counteract the effects of the halo implant, while the counter-halo implant is simultaneously shadowed from reaching the channel of the short-channel transistors. The embodiments disclosed herein can improve long-channel transistor DIBL, $G_{ds}$, and gain with little to no impact on short channel transistor performance, and without additional mask cost.

In some embodiments, the present disclosure relates to an integrated chip. The integrated chip comprises a first gate electrode arranged over a first channel region having a first length, and a second gate electrode arranged over a second channel region having a second length greater than the first length. The first channel region and the second channel region have dopant profiles, respectively along the first length and the second length, which have a dopant concentration that is higher by edges than in a middle of the first channel region and the second channel region. The dopant concentration is higher by the edges of the first channel region than by the edges of the second channel region.

In other embodiments, the present disclosure relates to an integrated chip. The integrated chip comprises a first gate electrode arranged over a first channel region having a first length between first source/drain regions, and a second gate electrode arranged over a second channel region having a second length between second source/drain regions, wherein the second length is greater than the first length. A first plurality of highly doped regions protrude from sides of the first source/drain regions into the first channel region. A second plurality of highly doped regions protrude from sides of the second source/drain regions into the second channel region. A dopant concentration of the first plurality of highly doped regions is greater than a dopant concentration of the second plurality of highly doped regions.

In yet other embodiments, the present disclosure relates to integrated chip. The integrated chip comprises a first gate electrode arranged over a first channel region having a first length between first source/drain regions, and a second gate electrode arranged over a second channel region having a second length between second source/drain regions, wherein the second length is greater than the first length. A first plurality of highly doped regions protrude from sides of the first source/drain regions into the first channel region. A second plurality of highly doped regions protrude from sides of the second source/drain regions into the second channel region. The second plurality of highly doped regions comprise a first dopant species and a second dopant species having opposite doping types.

What is claimed is:

1. An integrated chip, comprising:
  a first gate electrode arranged over a first channel region having a first length;
  a second gate electrode arranged over a second channel region having a second length greater than the first length;

wherein the first channel region and the second channel region have dopant concentration profiles, respectively along the first length and the second length, which have a dopant concentration that is higher at edges than in a middle of the first channel region and the second channel region;

wherein the dopant concentration is higher at the edges of the first channel region than at the edges of the second channel region; and wherein the dopant concentration profile within the first channel region has a first set of spatially separated bumps adjacent to opposing edges of the first gate electrode and the dopant concentration profile within the second channel region has a second set of spatially separated bumps adjacent to opposing edges of the second gate electrode.

2. The integrated chip of claim 1, further comprising:
a first gate dielectric layer comprising a first high-k dielectric material arranged below the first gate electrode; and
a second gate dielectric layer comprising a second high-k dielectric material arranged below the second gate electrode.

3. The integrated chip of claim 1, further comprising:
a first source region and a first drain region arranged on opposing sides of the first channel region;
a second source region and a second drain region arranged on opposing sides of the second channel region; and
lightly-doped-drain (LDD) regions arranged over the first source region and the first drain region.

4. The integrated chip of claim 3, further comprising:
a first plurality of highly doped regions arranged below the LDD regions and protruding outward from sides of the first source region and the first drain region into the first channel region;
a second plurality of highly doped regions arranged below the LDD regions and protruding outward from sides of the second source region and the second drain region into the second channel region; and
wherein a dopant concentration of the first plurality of highly doped regions within the first channel region is greater than a dopant concentration of the second plurality of highly doped regions within the second channel region.

5. The integrated chip of claim 4, wherein the first plurality of highly doped regions comprise a first highly doped region that protrudes outward from a side of the first source region and that is laterally separated from a second highly doped region that protrudes outward from a side of the first drain region.

6. The integrated chip of claim 4, wherein the second plurality of highly doped regions comprise a first dopant species and a second dopant species having opposite doping types.

7. The integrated chip of claim 6,
wherein the first dopant species comprises indium, boron, or carbon; and
wherein the second dopant species comprises phosphorous, antimony, or arsenic.

8. The integrated chip of claim 1, further comprising:
a layer of carbon containing material disposed over a substrate;
a layer of substrate material arranged between the layer of carbon containing material and the first gate electrode and the second gate electrode; and
a first plurality of highly doped regions protruding outward from sides of a first source region and a first drain region arranged on opposing sides of the first channel region, wherein the first plurality of highly doped regions are separated from the layer of carbon containing material by the substrate at locations below the first gate electrode.

9. The integrated chip of claim 8,
wherein the layer of carbon containing material has a first thickness in a first range of between approximately 2 nanometers and approximately 15 nanometers; and
wherein the layer of substrate material has a second thickness in a second range of between approximately 5 nanometers and approximately 30 nanometers.

10. The integrated chip of claim 8, further comprising:
a first lightly doped region and a second lightly doped region arranged along opposing sides of the first channel region and vertically extending from an upper surface of the layer of substrate material to the substrate.

11. The integrated chip of claim 1, wherein the first gate electrode and the second gate electrode have substantially equal heights.

12. The integrated chip of claim 1, further comprising
a first source region and a first drain region arranged on opposing sides of the first channel region; and
wherein the dopant concentration profile along the first channel region increases from a first concentration value adjacent to the first source region to a second concentration value below the first gate electrode, decreases from the second concentration value to a third concentration value, increases from the from the third concentration value to a fourth concentration value, and decreases from the fourth concentration value to a fifth concentration value adjacent to the first drain region.

13. An integrated chip, comprising:
a first gate structure arranged over a first channel region having a first length between first source/drain regions, wherein the first gate structure comprises a first gate electrode and a first gate dielectric layer;
a first plurality of highly doped regions protruding from sides of the first source/drain regions into the first channel region;
a second gate structure arranged over a second channel region having a second length between second source/drain regions, wherein the second length is greater than the first length and wherein the second gate structure comprises a second gate electrode and a second gate dielectric layer;
a second plurality of highly doped regions protruding from sides of the second source/drain regions into the second channel region;
wherein a dopant concentration of the first plurality of highly doped regions is greater than a dopant concentration of the second plurality of highly doped regions; and
wherein the first plurality of highly doped regions are vertically separated from the first gate structure by a first non-zero distance and the second plurality of highly doped regions are vertically separated from the second gate structure by a second non-zero distance.

14. The integrated chip of claim 13,
wherein the first channel region and the second channel region have dopant profiles, respectively along the first length and the second length, which have a dopant concentration that is higher at edges than in a middle of the first channel region and the second channel region; and wherein the dopant concentration is higher at the edges of the first channel region than at the edges of the second channel region.

15. The integrated chip of claim 13, wherein the second plurality of highly doped regions comprise a first dopant species and a second dopant species having opposite doping types.

16. The integrated chip of claim 13, wherein a dopant concentration profile along the first channel region has a first set of spatially separated bumps adjacent to edges of the first gate structure and a dopant concentration profile along the second channel region has a second set of spatially separated bumps that are smaller than the first set of spatially separated bumps and that are adjacent to edges of the second gate structure.

17. The integrated chip of claim 13, wherein a dopant concentration profile along the first channel region has at least three inflection points.

18. An integrated chip, comprising:
a first gate electrode arranged over a first channel region having a first length between a first source region and a first drain region;
a first plurality of highly doped regions protruding from sides of the first source region and the first drain region into the first channel region;
a second gate electrode arranged over a second channel region having a second length between a second source region and a second drain region, wherein the second length is greater than the first length;
a second plurality of highly doped regions protruding from sides of the second source region and the second drain region into the second channel region; and
wherein a dopant concentration profile within the first channel region increases from a first concentration value adjacent to the first source region to a second concentration value below the first gate electrode, decreases from the second concentration value to a third concentration value, increases from the from the third concentration value to a fourth concentration value, and decreases from the fourth concentration value to a fifth concentration value adjacent to the first drain region.

19. The integrated chip of claim 18, wherein a dopant concentration of a dopant species within the first plurality of highly doped regions is less than a dopant concentration of the dopant species within the second plurality of highly doped regions.

20. The integrated chip of claim 18, further comprising:
wherein a first dopant species comprises indium, boron, or carbon; and
wherein a second dopant species comprises phosphorous, antimony, or arsenic.

* * * * *